2/2/87 RE 32,430

United States Patent [19]

Sullivan

[11] E Patent Number: Re. 32,430

[45] Reissued Date of Patent: Jun. 2, 1987

[54] PRINTED WIRING BOARD

[76] Inventor: Donald F. Sullivan, 56 W. White Oak Rd., Paradise, Pa. 17562

[21] Appl. No.: 838,968

[22] Filed: Mar. 12, 1986

Related U.S. Patent Documents

Reissue of:

[64] Patent No.: 4,506,004
Issued: Mar. 19, 1985
Appl. No.: 364,309
Filed: Apr. 1, 1982

[51] Int. Cl.[4] ..... G03C 5/00; G03C 5/6

[52] U.S. Cl. ..... 430/312; 430/257; 430/311; 430/315; 430/319; 430/327; 430/394; 156/212; 156/230; 156/241; 156/574

[58] Field of Search ..... 430/312, 257, 311, 315, 430/319, 327, 394; 156/212, 230, 241, 574

[56] References Cited

U.S. PATENT DOCUMENTS

| | | | |
|---|---|---|---|
| 3,629,036 | 12/1971 | Isaacson | 156/241 |
| 3,824,104 | 7/1974 | Kloczewski et al. | 430/284 |
| 3,904,492 | 9/1975 | Rich et al. | 430/319 X |
| 3,984,244 | 10/1976 | Collier | 430/315 |
| 4,127,436 | 11/1978 | Friel | 156/630 |
| 4,230,793 | 10/1980 | Losert et al. | 430/315 |
| 4,234,626 | 11/1980 | Peiffer | 427/97 |
| 4,260,675 | 4/1981 | Sullivan | 430/315 |
| 4,344,998 | 8/1982 | de Leeuw et al. | 428/212 |

*Primary Examiner*—John E. Kittle

*Assistant Examiner*—José G. Dees

*Attorney, Agent, or Firm*—Laurence R. Brown

[57] ABSTRACT

An improved printed wiring board (PWB) with solder mask coatings is achieved by means of a two layer composite coating. One inner adhesive photopolymer layer is applied to the PWB in the liquid state, displacing air from PWB surface. The outer layer of the composite is dry and is carried on a thin plastic sheet and overlaminated onto the liquid inner layer, without the need for a vacuum laminator. The dry film solder mask so laminated is then exposed through a phototransparency to harden the light struck dry film solder mask and light struck inner layer photopolymer, thereby cojoining the dry film solder mask, inner layer and PWB surface. A solvent washout step removes unexposed dry film solder mask and unexposed inner layer photopolymer. This provides a faster process, requires less equipment, and improves adhesion to metal conductors. The outer layer need not be photoimaged. Thus, pre-patterned expoy solder masks may be printed on the carrier sheet, partially hardened and overlaminated in register onto liquid photopolymer-coated PWB, then exposed to light source through a phototransparency and through the pre-patterned solder mask, thereby permanently adhering the outer layer to PWB. The composite coating can be a combination of known solder mask materials, dry film, UV-curable and thermal-curing epoxy, chosen for desired characteristics including electrical performance, printing resolution and cost.

9 Claims, 1 Drawing Figure

FIGURE 2

| | |
|---|---|
| STEP 1 | COAT PWB WITH LIQUID PHOTOPOLYMER FILM |
| STEP 2 | TEMPORARILY AFFIX DRY FILM TO UNDERSIDE OF SCREEN PRINTING FABRIC |
| STEP 3 | PLACE COATED PWB UNDER AND OFF CONTACT WITH THE DRY FILM |
| STEP 4 | LAMINATE DRY FILM ON LIQUID FILM WITH SQUEEGEE BLADE DRAWN ACROSS TOP OF SCREEN FABRIC |
| STEP 5 | EXPOSE TO UV LIGHT SOURCE TO HARDEN WANTED POLYMER |
| STEP 6 | WASHOUT UNHARDENED AND UNWANTED POLYMER |
| STEP 7 | FINAL CURE COMPOSITE SOLDER MASK COATING |

| | |
|---|---|
| STEP 1 | PREPARE PHOTOMASK & TENSION IN MOUNTING FRAME |
| STEP 2 | COAT PWB & PHOTOMASK OVERALL WITH 1 MIL OF LIQUID PHOTOPOLYMER |
| STEP 3 | EXPOSE PHOTOPOLYMER SELECTIVELY THROUGH PHOTOMASK |
| STEP 4 | PLACE PHOTOMASK OVER COATED PWB OFF CONTACT AND IN REGISTER |
| STEP 5 | MATE THE TWO PHOTOPOLYMER SURFACES WITH RESILIENT BLADE |
| STEP 6 | EXPOSE MATED COMPOSITE TO HARDEN |
| STEP 7 | REMOVE PHOTOMASK |
| STEP 8 | WASH OUT UNHARDENED PHOTOPOLYMER |
| STEP 9 | FINAL CURE |

PRINTED WIRING BOARD

Matter enclosed in heavy brackets [ ] appears in the original patent but forms no part of this reissue specification; matter printed in italics indicates the additions made by reissue.

TECHNICAL FIELD

This invention relates to an improved printed wiring board and its solder mask coating and corresponding manufacturing process to achieve said PWB.

BACKGROUND ART

In the manufacture of printed wiring boards (PWB) it is customary to coat the PWB with a polymer coating at all locations except where electrical contact is to be made with the metal conductors. This polymer coating is referred to as solder mask or solder resist. When the solder-masked PWB is populated with components and wave soldered, the solder mask confines the solder to the conductors and prevents short circuits between adjacent conductors. The solder mask remains on the PWB and serves as a life-long insulation and environmental barrier.

In common use are three major types of solder mask polymers: thermal curing expoxy, ultra-violet (UV)-curing photopolymers and dry film photopolymers. The epoxies and UV-curables are applied to the PWB as liquid coatings screen printed, while the dry film solder mask is applied in a vacuum chamber.

This disclosure shows a method for achieving an improved solder mask with the available dry film photopolymers, UV-curables, and thermal-curing epoxies.

Dry film solder mask photopolymers are supplied by two manufacturers, in roll form, consisting of an inner layer of photopolymer sandwiched between a carrier film of clear polyester and a polyolefin liner. On a typical PWB the metal conductors extend 0.003 to 0.004 inch above the base laminate, a fact which complicates the application of the dry film solder mask onto the PWB surface. The use of a roller laminator is not usually satisfactory, as air is trapped between the photopolymer and the PWB laminate, particularly between closely-spaced conductors. A vacuum chamber laminator is normally used to prevent air entrapment. The lamination cycle is as follows: A PWB and a section of dry film solder mask is inserted into the heated chamber; the chamber is evacuated, and when up to temperature the photopolymer is forced into contact with the PWB, effecting an air-free lamination. Lamination occurs at a temperature of the order of 200 degrees F., at which temperature the dry film solder mask photopolymer becomes tacky and adheres to the PWB surface. The solder mask is completed by exposing the photopolymer to a strong UV light source through a photographic film, wherein the light hardens the exposed photopolymer. The polyester carrier film is then peeled away and the unhardened photopolymer is washed out in a solvent spray bath.

There are several shortcomings with the dry film solder mask which this invention helps to overcome. These are listed below:

1. The cost of the achieved solder mask is excessive. The single photopolymer layer is expensive being of the order of four times the cost of liquid photopolymers; the equipment required to laminate is overly complicated and expensive; the labor required is excessive, as each processing step of laminating, exposing, and developing is overly lengthy.

2. The laminating step forces photopolymer into circuit holes, with the result that with small holes of the order of 0.025 inch diameter, the photopolymer does not wash out, leaving the holes plugged.

3. The laminating step forces photopolymer into large tooling holes and slots, leaving a puckered, striated coating of photopolymer, for the polyester carrier film is non-conforming and wrinkles around larger holes and sharp corners.

4. The dry photopolymer is characterized by a lack of adhesion to metal conductors. For PWB having bare copper conductors with dry film solder mask thereover, the solder coating and hot-air leveling step is usually not satisfactory without copper surface pretreatment as with a black oxide coating; otherwise the solder mask separates from the conductors.

5. The photopolymer is temperature sensitive, delaying the application sequence. After laminating at 200 degrees F., the photopolymer must cool to room temperature prior to exposure. After exposure, which raises the temperature again, the photopolymer must cool to room temperature before washing out unexposed photopolymer.

DISCLOSURE OF THE INVENTION

This disclosure teaches an improved method for achieving solder masks using a two-layer construction: an inner layer of a liquid adhesive photopolymer and an outer layer consisting of one of four known types of solder mask polymers:

1. Dry film solder mask photopolymer.
2. UV-curable solder mask photopolymer.
3. Dry epoxy photopolymer solder mask.
4. Dry epoxy solder mask transfers, non-photoimaging.

The combinations of inner and outer layer polymers yield a wide range of composite coating characteristics, including electrical performance, environmental reaction, printing placement accuracy, adhesion and cost.

Reference is made to U.S. Pat. No. 3,824,104 in which Kloczewski teaches a method for photoimaging a UV-curable solder mask photopolymer, wherein the image bearing photomask is separated from the photopolymer by a distance of eight mils during exposure, leading to a stated loss of resolution.

Reference is made to U.S. Pat. No. 4,260,675 in which Sullivan describes a method for photoimaging UV-curable solder mask photopolymer using a glass plate photomask with raised opaque pillars in contact only with portions of the PWB which will be free of hardened solder mask.

Each of these patents and current practices in the art of PWB manufacture has characteristics which this invention seeks to improve.

One objective is to improve the adhesion of dry film solder mask to metal conductors.

A second objective is a process to laminate a dry film solder mask to a highly irregular surfaced PWB without use of a vacuum laminator.

Another objective is to reduce the time required to process dry film solder mask by negating the requirement for laminating at an elevated temperature.

Another objective is to achieve a photoimaged solder mask having the electrical and environmental characteristics of dry film, but at reduced cost.

Another objective is to achieve a photoimaged PWB solder mask in which UV-curable liquids are exposed with a photomask in contact with the liquid, and in which the solder mask coating is not thinned out over the metal conductors.

Before the dry film solder mask is applied to the PWB, a coating of liquid photopolymer is screen printed over the entire PWB surface so as to coat both the circuit traces and the base laminate, and in so doing all air is displaced from the PWB surface by the liquid polymer. The dry film solder mask photopolymer is then laminated onto the liquid polymer coated PWB without the need for a vacuum laminator.

In one embodiment, the composite polymer coating is then exposed to a strong UV light source through a photographic film mask, with light struck area being hardened sufficiently to withstand the subsequent solvent washout step.

When the outer layer is formed from a UV-curable liquid, then the process includes the formation of a semi-cured coating on an image-bearing transparency and the overlamination of the transparency onto the coated PWB in register. A second exposure step bonds the two layers together and to the PWB. The formation of the semi-cured coating prevents photopolymer thin-out or starvation on the raised metal conductors.

When the outer layer is a dry epoxy photopolymer carried on a thin plastic sheet, then the process is the same as for dry film solder mask.

When the outer layer is a non-imaging dry-epoxy coating carried on a thin transparent sheet, then the procedure is to apply the coating to the transparent sheet in the liquid state by screen printing the desired image, then curing to a semi-cured state, and then laminating to the coated PWB. When the inner layer is exposed to a light source through the outer coating and through an image bearing transparency, then the inner layer thus exposed bonds the epoxy outer layer thereto. Unexposed inner layer photopolymer is washed out in a solvent and the composite mask completed by a final curing step.

THE DRAWING

In the drawing:

FIG. 2 is a block diagram showing the procedure for producing the dry film mask—UV-curable solder mask composites of one embodiment of the invention; and FIG. 3 is a block diagram showing the procedure for a further embodiment for producing solder masks with UV-curable photopolymers.

PREFERRED EMBODIMENTS

Figure 1:
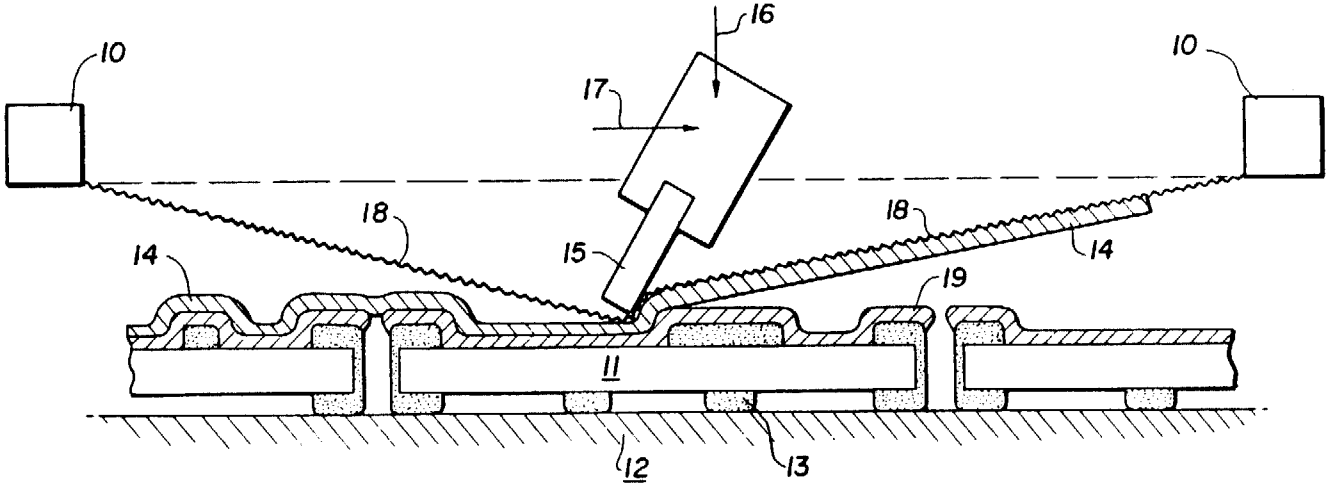
FIG. 1 is a sectional cut-away showing the lamination apparatus as a coated board is laminated with dry film solder mask.

A brief description of the physical and electrical characteristics of solder mask materials is discussed so that the advantage afforded by the disclosed process will be more obvious. Table 1 compares the generalized properties of three major types of solder mask materials: screen-printed epoxies, screen-printed UV-curable photopolymers, and dry film solder masks, with the disclosed composite dry film—UV-curable photopolymer of this invention.

TABLE 1

| | Property | Screen Printed Epoxy | Screen Printed UV-Curable Solder Mask | Dry Film Solder Mask | Dry Film Solder Mask Composite With Liquid Inner Layer |
|---|---|---|---|---|---|
| 1. | Adhesion | Excellent | Fair | Poor | Excellent |
| 2. | Environmental | Excellent | Fair | Excellent | Excellent |
| 3. | Electrical | Excellent | Fair | Excellent | Excellent |
| 4. | Printing Resolution | Poor | Poor | Excellent | Excellent |
| 5. | Material Cost Per Unit Area | γ | 1.5 | 6 | 4 |
| 6. | Application Time | 1.25 | 1 | 5 | 2 |
| 7. | Application Equipment Cost | 1 | 4 | 20 | 5 |
| 8. | Total Application Cost | 1 | 1 | 5 | 2 |
| 9. | Application Operator Skill Level Required | Highly Skilled | Highly Skilled | Unskilled | Unskilled |

As shown in Table 1, the traditional solder mask epoxies are the best solder mask materials for PWB when the relatively poor printing resolution can be tolerated, whereas the dry film solder mask is outstanding in electrical and environmental characteristics and resolution, and requires little operator skill. Dry films, however, are costly and suffer poor adhesion. As described earlier, a coating of liquid photopolymer applied over the entire PWB surface prior to dry film application allows an air-free lamination to be effected with relatively inexpensive equipment, while the adhesion of the composite is improved over dry film alone. The electrical and environmental characteristics are both excellent, as determined primarily by the dry film outer coating. Material cost is reduced, for instead of a required 3 mil dry film thickness, the composite can be 1 mil of dry film and 1 mil of UV-curable photopolymer.

As described earlier there are four types of solder mask polymers currently in use in PWB manufacture, and each of these types has advantages and disadvantages when used alone.

The applicant has developed manufacturing processes for each of these four types of solder mask used in a two-layer composite coating, with the inner layer being a liquid photopolymer. Each of these four types (generally termed dry film composites herein) will be described in subsequent paragraphs of this detailed description, namely with outer layers:

1. Dry film solder mask photopolymer.
2. Partially-cured UV-curable solder mask photopolymer.
3. Dry epoxy solder mask photopolymer.
4. Dry epoxy solder masks, non-photoimaging.

While the main thrust of this disclosure is a composite coating having a liquid photopolymer inner layer, the applicant has also developed a process for making a two-layer composite in which both layers are thermal-curing epoxies, in which the solder mask patterns are formed on a thin plastic sheet, partially-cured to a dry state as in Example No. 4, then transferred to PWB having a liquid coating of an epoxy of 100 percent solids. The outer layer then shields the wanted inner layer from a washout solvent which removes uncovered inner layer epoxy. This process is detailed in Example No. 5.

As used in this disclosure a liquid polymer has a range of viscosities from that of a fluid to heavy paste-consistency; viscosities normally encountered in liquids used in screen printing, roller coating, and curtain coating.

EXAMPLE 1

Dry Film Photopolymer Covering Liquid Photopolymer Inner Layer

Reference is made to FIG. 2, showing the steps to be followed to achieve a composite photoimaged solder mask coating. Step 1 is to coat the PWB having traces 0.004 inch high with a liquid polymer coating 0.001 inch thick. A polyester or nylon screen printing fabric of 125 mesh produces the 0.001 inch coating. The liquid polymer is the W. R. Grace "Unimask 1000" UV-curable solder mask photopolymer which is 100 percent solids and does not outgas during curing.

The dry film solder mask is prepared for laminating to the coated PWB. A section of Dupont "720S Vacrel" dry film with polyolefin liner film is temporarily adhered to the underside of a second screen printing frame having a nylon or polyester fabric of 235 mesh with the polyester carrier film in contact with the screen. The adhesive is the 3M "Spray Mount" adhesive. After adhering, the polyolefin liner film is removed.

Lamination, Step 4, is accomplished by placing the coated PWB under the printing frame with affixed dry film off-contact, then drawing a squeegee blade the length of the PWB across the top side of the fabric. This step forces the dry film into intimate contact with the polymer in such a way that no air is trapped.

Reference is made to FIG. 1, a partial sectional cutaway drawing of the PWB being laminated. PWB 11 with metal conductors 13 rests on surface 12. Screen frame members 10 tension and restrain polyester fabric 18. Dry film photopolymer 14 is shown mated with the PWB behind blade 15 and adhered to screen fabric 18 ahead of the blade. Force 16 causes blade 15 to move downward, forcing photopolymer 14 to contact liquid polymer layer 19. Force 17 causes blade 15 to scan the length of PWB 11. Photopolymer 14 is temporarily adhered to fabric 18 by a light adhesive coating, not shown in FIG. 1.

After lamination, the composite is moved away from fabric 18 and then exposed to a strong UV light source through a photographic film positive, thereby hardening the wanted dry film solder mask and the underlying liquid photopolymer. For example, the Colight "DMVL-HP" exposes the composite in five minutes. After exposure, the uppermost polyester carrier sheet (not shown) is peeled away from the dry film photopolymer. Unhardened photopolymer 14 is washed out in a Dupont "A24" processor using trichloroethane spray for a period of two minutes. Liquid polymer 19 not covered by hardened photopolymer is also washed away by the trichloroethane.

There may be some undercutting of the inner layer photopolymer by the trichloroethane, leaving a slight annular ring around openings in the dry film solder mask where the underlying photopolymer is washed away. This condition is largely eliminated by using the Dupont aqueous dry film solder mask, in which the unexposed photopolymer is washed out in a Dupont proprietary water-based solvent. This solvent does not remove the inner layer. A second washout bath of trichloroethane for 20 seconds serves to washout unwanted inner layer photopolymer cleanly without significant undercutting of the hardened dry film solder mask.

Final cure of the composite film is accomplished by exposure to a strong UV lamp source to fully cure the photopolymer. A conveyorized UV curing unit having two lamps, each rated at 200 watts per linear inch cures the photopolymer at a speed of five feet per minute. Argus International of Hopewell, N.J. manufactures a suitable UV curing unit.

While the aforementioned UV-curable solder mask photopolymer, the "UNIMASK 1000", can be used as the inner layer, the five-minute exposure cycle can be reduced by use of a photopolymer having a higher photospeed. Such a photopolymer can be formulated by combining the following:

| | |
|---|---|
| CELANESE RADIATION CURABLE RESIN "RR-27418" | 100 PARTS |
| BENZOPHENONE | 3 PARTS |
| N—METHYLDIETHANOLAMINE | 2 PARTS |

EXAMPLE 2

UV-Curable Solder Mask Covering Liquid Photopolymer Inner Layer

When photoimaging a liquid photopolymer, to obtain high resolution it is preferable to use a contact system, whereby the photographic film is pressed into intimate contact with the photopolymer during the exposure cycle. When the paste consistency liquid photopolymer is covering a PWB having a highly irregular surface topology, there is the problem of photopolymer starvation or thin-out over the conductors, for pressure on the phototool forces the photopolymer to extrude sidewards and off the conductors.

Photopolymer starvation in this disclosure is prevented by use of a composite solder mask, wherein the outer layer is formed on the surface of an image-bearing photomask or photographic film positive containing opaque dots on a transparent field. This outer layer is deposited onto the photomask surface to a thickness of 0.001 inch by screen printing. Exposure to a UV light source through the photomask partially hardens the light-struck photopolymer. The photomask is then mated with a PWB which has been coated overall with a thin layer of paste consistency solder mask photopolymer, in register, so that the phototool opaque areas are positioned over the PWB circuit conductor pads which are to be free of hardened solder mask. Mating is best accomplished by use of a resilient blade. The partially hardened photopolymer does not extrude from the top of the conductors. The assembly is exposed to a strong UV light source through the mated photomask, so as to harden the photopolymer down to the PWB base laminate. The solder mask is completed by removing the phototool and subjecting the PWB to a solvent spray bath to remove unhardened photopolymer and then final curing with a UV curing unit.

FIG. 3 shows the processing steps to be followed.

Step 1 is to prepare a special photomask which will have a non-stick release surface coating, and which will withstand the high temperature of the light source, while maintaining dimensional stability. The photomask consists of a clear polyester sheet stretched in a four-sided frame. Photomasks for PWB having higher conductors may be contoured for additional protection against photopolymer starvation over raised surfaces. Contouring is achieved by pressing the phototool onto an uncoated PWB with sufficient force to permanently distort or coin the photomask lower surface to match the contour of PWB surface. Alternatively, contouring can be achieved by molding the thin release coating to the PWB conductor pattern. The opaque areas were previously screen printed onto the polyester sheet.

A thin release coating of Dow Corning "734 RTV" is applied to prevent the photopolymer from sticking. Next, the PWB is coated by screen printing with W. R. Grace "Unimask 1000" photopolymer, using a 125 mesh fabric to deposit a 0.001 inch thickness. The same screen mesh is used to coat the photomask overall with a 0.001 inch thick coating.

Step 3 is to harden the wanted photopolymer on the photomask. A two-minute exposure with the Colight "DMVL-HP" is used.

Steps 4–9 cover the placement of the photomask above and off contact the PWB: mating, reexposure to UV light, solvent washout of unwanted photopolymer, and final cure. These steps are as previously described for the dry film solder mask/liquid photopolymer composite and need not be repeated here.

EXAMPLE 3

Dry Epoxy Solder Mask Photopolymer Outer Layer

A solder mask epoxy photopolymer known as "Probimer 52" is available from CIBA - GEIGY Company of Ardsley, N.Y. This photopolymer is normally applied to the PWB by curtain coating, then oven baked to drive off volatiles until dry, then photoimaged through a photo transparency to further harden wanted photopolymer. Unexposed photopolymer is washed out in a solvent spray bath. This photopolymer is used as the outer layer in the disclosed process in conjunction with the liquid photopolymer inner layer.

The disclosed process includes the coating of a thin transparent plastic sheet having a release surface coating with the "Probimer" liquid and heating until the volatiles are driven off. The resulting dry epoxy photopolymer is processed as described in Example 1 for dry film solder mask. Dupont product "Vacrel 7205". The solvent used to washout the unexposed "Probimer" photopolymer is cyclohexanone.

EXAMPLE 4

Dry Epoxy Solder Mask, Non-photoimaging

As shown in Table 1, thermal curing epoxies have excellent electrical and environmental characteristics, are low in cost, but exhibit relatively poor printing resolution. The disclosed two-layer solder mask composite using an epoxy outer layer bonded to the PWB by an inner layer of liquid photopolymer retains the primary advantages of the epoxy while improving the printing resolution. First, a thin transparent polyester sheet having a release coating is screen printed with catalyzed "PC-401" epoxy in the correct pattern, which is then cured to the point of being dry but still flexible. To overlaminate the epoxy coating onto the coated PWB, the thin transparent sheet carrying the epoxy is temporarily adhered to the underside of a printing screen and laminated onto the coated PWB, the same way as described in Example 1 for the dry film solder mask, the exception being that the epoxy patterns are properly registered with the PWB circuitry. At this point in the process, the epoxy outer coating covers the PWB overall except for openings to be free of solder mask such as circuit pads, contact fingers, and tooling holes. Circuit pads are covered with the photopolymer liquid.

To bond the epoxy coating to the PWB, the liquid photopolymer inner layer is exposed to a light source through the epoxy coating and through an image-bearing phototransparency. Opaque areas on the phototransparency prevents the photopolymer from being hardened in those PWB areas to be free of all solder mask.

The solder mask is completed by washing out the unexposed photopolymer in trichloroethane and final curing by exposure to a high intensity mercury vapor lamp to cure the photopolymer, and a bake cycle to completely cure the epoxy.

This process improves the solder mask resolution in two ways. First, the epoxy image is printed on a flat surface, wherein the resolution is much improved over printing over the irregular PWB surface. Second, the inner layer is photoimaged, thereby achieving near-exact conformance of solder mask with phototransparency opaque patterns.

Where legends or nomenclaturing is required, the lettering ink is deposited on the carrier sheet first, and the epoxy solder mask patterns overprinted then partially cured, firmly adhering the lettering to the outer solder mask layer. Transfer to the coated PWB is effected as previously described for patterned dry epoxy.

EXAMPLE 5

Non-photoimaging Epoxy Inner Layer

The superior adhesion of a thermal-curing epoxy is utilized in this process to bond an outer layer of solder mask polymer to PWB. As in Example 4, the desired solder mask pattern is screen printed onto a thin plastic sheet having a non-stick surface coating to a thickness of 0.001 inch. Solder mask epoxy "PC 401" as sold by Nationwide Circuit Products can be used. This epoxy pattern is partially cured by a bake cycle of 250 degrees F. for 15 minutes. Next the PWB is coated with a 0.001 inch layer of Epoxy Technology Company "EPO-TEK 730" catalyzed epoxy, which is 100-percent solids and does not outgas while curing.

Preparatory to laminating the two epoxy layers, the plastic sheet carrying the partially cured epoxy pattern is temporarily adhered to the underside of a printing screen, and placed above and off contact the coated PWB, in register. A resilient blade drawn across the top surface of the printing screen laminates the two together without air entrapment. The plastic carrier sheet is peeled away, leaving the two layers joined by epoxy adhesion.

The portions of the inner layer not covered by the outer layer is washed out in a trichloroethane spray, while the wanted portions of the inner layer are protected by the outer layer and are thus shielded from the washout solvent.

Following washout, a bake cycle of 250 degrees F. bonds the two layers with the PWB.

In addition to its use in solder masking as described in the five preceding examples, the disclosed composite coating has been used by the applicant to achieve photoimaged plating resist and etch resist patterns used to define the metal conductor patterns on the PWB base laminate.

The process for achieving a composite plating resist or etch resist coating is as described in Example 2, but substituting the LONDON CHEMICAL COMPANY etch resist 1095 LUV for the UNIMASK 1000 solder mask. In addition to the 1095 LUV, which can be removed from the PWB after etching, the process described in Example 2 can be used to form permanent photopolymer coatings using the PPR 101, a permanent plating resist manufactured by the Haven Corporation of Baltimore, Md.

I claim:

1. The process of producing chemically resistant polymer images which define [the conductor] *a* pattern on a printed wiring board, comprising the steps of, coating the printed wiring board surface with a coating of a liquid photopolymer resist, depositing a layer of [said] liquid photopolymer resist of predetermined thickness on a carrier sheet, disposing said carrier sheet adjacent said coated printed wiring board, laminating together the liquid coatings on said carrier sheet and printed wiring board surface [at ambient temperature and pressure], thereby forming on the surface of the board a composite layer free of air pockets, exposing both said layers to a radiation source through a pattern for hardening the polymer layers in selected positions to form said images on said printed wiring board, removing said carrier sheet, and washing out the unhardened photopolymer.

2. The process of claim 1 including the steps of superimposing an image bearing photo transparency sheet on said two laminated layers and exposing the layers by radiation passed through said image to form a solder mask leaving exposed only those parts of the circuit traces to receive solder.

3. The process of claim 1 including the steps of producing a photo transparency image on said carrier sheet to comprise said pattern for hardening the conductor layers and photo exposing both the layers by radiation passed through this said pattern.

4. The process for producing a solder mask coating on a printed wiring board having electrical conductors disposed on an insulating surface in a pattern leaving exposed only predetermined areas of printed wiring to which solder will adhere, comprising the steps of, coating over the printed wiring board rough contour surface configuration caused by circuit trace patterns extending from the insulating surface a layer of liquid polymer adhesive of predetermined thickness overlying the electrical conductors and insulating surface free from air pockets between the layer and the rough contour board surface, depositing a layer of solder mask polymer of predetermined thickness on a carrier surface, transferring said solder mask polymer layer as an outer surface layer onto the printed wiring board surface coated with liquid photopolymer in the liquid phase [at ambient temperature and pressure] thereby to conform with the wiring board surface configuration and forming thereby on the surface of the board two laminated layers of polymer [of differing characteristics], exposing both said layers to a radiation source through a pattern for hardening the polymer layers in selected positions to form said solder mask and said predetermined unexposed areas to which solder will adhere, washing out the unhardened polymer layers, and curing the remaining composite coating to form the solder mask coating, wherein the solder mask layer is a liquid photopolymer including the steps of forming on said carrier surface an image defining the solder mask pattern, depositing the liquid photopolymer solder mask layer on the carrier surface and exposing the solder mask layer to radiation to selectively harden the solder mask layer and produce thereby the solder mask pattern before transferring onto the board surface.

5. The photo process for producing chemically resistant polymer images which define a photo induced pattern on a substrate surface, comprising the steps of, coating the substrate surface with a first layer of predetermined uniform thickness greater than about one mil (0.0025 cm) of a non volatile photo curable liquid polymer which is 100% solids and does not outgas during curing for forming thereupon by exposure from a radiation source a photo pattern adhering to the substrate surface, laminating upon said first layer a second layer comprising a covering layer of non-volatile curable liquid photopolymer material of predetermined uniform thickness greater than about one mil (0.0025 cm) to form with said first layer a two layer composite photo responsive coating free of air pockets between the two coating layers and between the composite layer and the substrate because of adhesion properties of the first liquid layer, exposing both said layers to a radiation source through a photo pattern for hardening the photopolymers in selected positions to form photo images on said substrate, and developing the photo images by washing out the unhardened photopolymer, whereby removal of the unhardened liquid polymer layer in contact with the substrate is simple and complete.

6. The process of claim 5 wherein the laminated photopolymer layers are of the type that are hardened by exposure to the radiation.

7. The photo process of claim 6 including the step of partly curing the liquid photopolymer second layer by exposure to radiation before lamination.

8. The photo process of claim 7 including the step of exposing the second layer through a photo pattern to produce a pattern of cured photopolymer on that layer.

9. The photo process of claim 5 including the step or forming each layer with approximately the same thickness of about one mil (0.0025 cm) to form a compositive uniform thickness layer of about two mils (0.0050 cm).

* * * * *